United States Patent
Shahine (10) Patent No.: US 7,620,081 B2
(45) Date of Patent: Nov. 17, 2009

(54) SEMICONDUCTOR LASER UTILIZING REAL-TIME LINEWIDTH REDUCTION METHOD

(75) Inventor: Michael Haidar Shahine, Ellicott City, MD (US)

(73) Assignee: Ciena Corporation, Linthicum, MD (US)

(*) Notice: Subject to any disclaimer, the term of this patent is extended or adjusted under 35 U.S.C. 154(b) by 0 days.

(21) Appl. No.: 11/524,651

(22) Filed: Sep. 21, 2006

(65) Prior Publication Data

US 2008/0075131 A1 Mar. 27, 2008

(51) Int. Cl.
*H01S 3/13* (2006.01)

(52) U.S. Cl. .......................... 372/29.011; 372/29.01; 372/29.02; 372/32; 372/30

(58) Field of Classification Search ............ 372/29.011, 372/29.01, 29.02, 29.021–32
See application file for complete search history.

(56) References Cited

U.S. PATENT DOCUMENTS

| 4,847,477 | A | * | 7/1989 | Smith ..................... 250/201.9 |
| 5,127,731 | A | * | 7/1992 | DeGroot ..................... 356/486 |
| 5,311,005 | A | | 5/1994 | Visocchi |
| 5,780,916 | A | * | 7/1998 | Berger et al. ................ 257/471 |
| 6,560,258 | B1 | * | 5/2003 | McQuilkin ............... 372/38.02 |
| 2003/0067948 | A1 | * | 4/2003 | Tatsuno et al. ................ 372/32 |

OTHER PUBLICATIONS

Yamamoto, Y., at al., "Theory of a Negative Frequency Feedback Semiconductor Laser", IEEE Journal of Quantum Electronics; vol. QE-21, No. 12, Dec. 1985.

Kazarinov, R., et al., The Relation of Line Narrowing and Chirp Reduction Resulting from the Coupling of a Semiconductor Laser to a Passive Resonator, IEEE Journal of Quantum Electronics, vol. QE-23, No. 9, Sep. 1987.

Sasai, Y., et al., "Spectral Linewidth and Resonant Frequency Characteristics of InGaAsP/InP Multiquantum Well Lasers", IEEE Journal of Quantum Electronics, vol. 25, No. 4, Apr. 1989.

Kikuchi, K., "Effect of 1/f-Type FM Noise on Semiconductor-Laser Linewidth Residual in High-Power Limit", IEEE Journal of Quantum Electronics, vol. 25, No. 4, Apr. 1989.

* cited by examiner

*Primary Examiner*—Minsun Harvey
*Assistant Examiner*—Xnning Niu
(74) *Attorney, Agent, or Firm*—Clements Bernard PLLC; Christopher L. Bernard; Tyler S. Brown (57) ABSTRACT

A system for real-time linewidth reduction in an optical source includes a laser device comprising a back facet, wherein the laser device receives a modulated input current and generates an optical output signal; an etalon device disposed adjacent to the back facet of the laser device, wherein the etalon device receives an optical feedback output signal from the back facet of the laser device, and wherein the etalon device monitors the optical feedback output signal for changes in frequency and, if they exist, generates an optical correction output signal; a photo-detector device disposed adjacent to the etalon device, wherein the photo-detector device receives the optical feedback and correction output signals, and wherein the photo-detector device converts the optical feedback and correction output signals into an electrical signal; and a feedback correction loop coupled to the photo-detector device, wherein the feedback correction loop receives the electrical signal from the photo-detector device and generates a substantially linear feedback current. The input current is modified by the substantially linear feedback current to form the modulated input current.

22 Claims, 4 Drawing Sheets

SEMICONDUCTOR LASER UTILIZING REAL-TIME LINEWIDTH REDUCTION METHOD

FIELD OF THE INVENTION

The present invention relates generally to semiconductor lasers that are used in the transmitters, amplifiers, and receivers of optical telecommunications systems, among other semiconductor lasers. More specifically, the present invention relates to a semiconductor laser utilizing a real-time linewidth reduction method.

BACKGROUND OF THE INVENTION

Semiconductor lasers are used in various portions of the transmitter, amplifier, and receiver chains of optical telecommunications systems. Typically, these transmitter and receiver semiconductor lasers utilize a frequency modulation (FM) scheme and coherent system architecture, and must have a relatively narrow linewidth (of around 0.007 pm, for example). The linewidth is the width of the laser frequency, and is much narrower than that of visible light, for example. The receiver semiconductor lasers are also referred to as "Local Oscillators" and are used to generate signals that are mixed with signals of interest in order to generate different frequencies. These amplifier semiconductor lasers utilize frequency stabilization and an optical feedback scheme using a fiber Bragg (FB) grating, for example. The amplifier semiconductor lasers are also referred to as "pump lasers" and are used to transfer energy into the gain medium of another laser, the pump power exceeding the lasing threshold of that laser. The transmitter and receiver semiconductor lasers are specially designed with large cavity structures in order to reduce their linewidth, or utilize a master/slave laser scheme. These components and concepts are well known to those of ordinary skill in the art.

As is also well known to those of ordinary skill in the art, an FB grating is a diffraction grating segment of an optical fiber that filters out particular wavelengths of light. This filtering is achieved by altering portions of the optical fiber core such that their indices of refraction are slightly higher than normal. This is accomplished using an intense ultraviolet (UV) source and a photomask, for example, combined with various receptive optical fiber core material compositions. As a result, the FB grating transmits most wavelengths of light, but reflects the particular wavelengths of light. The FB grating typically has a sinusoidal index of refraction variation over a defined length and may include one or more "chirps."

The schemes and architectures described above are less than desirable due to the fact that the specially designed cavity structure and the like are relatively costly and there is no real-time mechanism to control and adjust this laser parameter. In addition, for the pump lasers, the optical feedback is relatively unstable due to the location of the mirror (FB grating). This mirror is also susceptible to temperature and environmental changes. Thus, what is needed is a semiconductor laser utilizing an effective real-time linewidth reduction method. In addition, this semiconductor laser should be compact in nature.

BRIEF SUMMARY OF THE INVENTION

In various exemplary embodiments, the present invention provides a compact semiconductor laser that utilizes electrical feedback to correct for frequency noise in real-time, such that, no matter what the shift in the frequency of the laser is, the electrical feedback compensates for the shift in the frequency of the laser by amplifying a portion of the output signal of the laser that is measured at the back facet of the laser using an etalon that senses the frequency change and converts it into an amplitude change. This amplitude change is combined with the input signal of the laser using a standard negative feedback control method. When the gain of the feedback loop is relatively high, the overall transfer function of the system is dependent on the feedback loop gain block, which is substantially linear and does not shift in frequency. This is accomplished via a large bandwidth photo-detector that is disposed at the back facet of the laser that monitors the optical output power of the etalon and provides a feedback signal to a feedback control circuit. The signal from the large bandwidth photo-detector is used to modify the injection current in order to correct for the large linewidth of the laser.

In one exemplary embodiment of the present invention, a system for real-time linewidth reduction in an optical source includes a laser device comprising a back facet, wherein the laser device receives a modulated input current and generates an optical output signal. The system also includes an etalon device disposed adjacent to the back facet of the laser device, wherein the etalon device receives an optical feedback output signal from the back facet of the laser device, and wherein the etalon device monitors the optical feedback output signal for changes in frequency and, if they exist, generates an optical correction output signal. The system further includes a photo-detector device disposed adjacent to the etalon device, wherein the photo-detector device receives the optical feedback and correction output signals, and wherein the photo-detector device converts the optical feedback and correction output signals into an electrical signal. Finally, the system includes a feedback correction loop coupled to the photo-detector device, wherein the feedback correction loop receives the electrical signal from the photo-detector device and generates a substantially linear feedback current. The input current is modified by the substantially linear feedback current to form the modulated input current.

In another exemplary embodiment of the present invention, the method for real-time linewidth reduction in an optical source includes providing a laser device comprising a back facet, wherein the laser device receives a modulated input current and generates an optical output signal. The method also includes providing an etalon device disposed adjacent to the back facet of the laser device, wherein the etalon device receives an optical feedback output signal from the back facet of the laser device, and wherein the etalon device monitors the optical feedback output signal for changes in frequency and, if they exist, generates an optical correction output signal. The method further includes providing a photo-detector device disposed adjacent to the etalon device, wherein the photo-detector device receives the optical feedback and correction output signals, and wherein the photo-detector device converts the optical feedback and correction output signals into an electrical signal. Finally, the method includes providing a feedback correction loop coupled to the photo-detector device, wherein the feedback correction loop receives the electrical signal from the photo-detector device and generates a substantially linear feedback current. The input current is modified by the substantially linear feedback current to form the modulated input current.

In a further exemplary embodiment of the present invention, a system for real-time linewidth reduction in an optical source includes a laser device comprising a back facet, wherein the laser device receives a modulated input current and generates an optical output signal. The system also includes an etalon device disposed adjacent to the back facet of the laser device, wherein the etalon device receives an optical feedback output signal from the back facet of the laser device, and wherein the etalon device monitors the optical feedback output signal for changes in frequency and, if they exist, generates an optical correction output signal. The system further includes a photo-detector device disposed adjacent to the etalon device, wherein the photo-detector device receives the optical feedback and correction output signals, and wherein the photo-detector device converts the optical feedback and correction output signals into an electrical signal. The photo-detector device comprises a primary photo-detector device that receives the optical correction output signal from the etalon device and a reference photo-detector device that receives the optical feedback output signal from the back facet of the laser device. Finally, the system includes a feedback correction loop coupled to the photo-detector device, wherein the feedback correction loop receives the electrical signal from the photo-detector device and generates a substantially linear feedback current. The input current is modified by the substantially linear feedback current to form the modulated input current.

DESCRIPTION OF THE DRAWINGS

The present invention is illustrated and described herein with reference to the various drawings, in which like reference numbers are used to refer to like system components/method steps, as appropriate, and in which.

DETAILED DESCRIPTION OF THE INVENTION

As described above, semiconductor lasers are used in various portions of the transmitter, amplifier, and receiver chains of optical telecommunications systems. Typically, these transmitter and receiver semiconductor lasers utilize an FM scheme and coherent system architecture, and must have a relatively narrow linewidth (of around 0.007 pm, for example). The linewidth is the width of the laser frequency, and is much narrower than that of visible light, for example. The receiver semiconductor lasers are also referred to as Local Oscillators and are used to generate signals that are mixed with signals of interest in order to generate different frequencies. These amplifier semiconductor lasers utilize frequency stabilization and an optical feedback scheme using an FB grating, for example. The amplifier semiconductor lasers are also referred to as pump lasers and are used to transfer energy into the gain medium of another laser, the pump power exceeding the lasing threshold of that laser. The transmitter and receiver semiconductor lasers are specially designed with large cavity structures in order to reduce their linewidth, or utilize a master/slave laser scheme.

An FB grating is a diffraction grating segment of an optical fiber that filters out particular wavelengths of light. This filtering is achieved by altering portions of the optical fiber core such that their indices of refraction are slightly higher than normal. This is accomplished using an intense UV source and a photomask, for example, combined with various receptive optical fiber core material compositions. As a result, the FB grating transmits most wavelengths of light, but reflects the particular wavelengths of light. The FB grating typically has a sinusoidal index of refraction variation over a defined length and may include one or more "chirps."

The schemes and architectures described above are less than desirable due to the fact that the specially designed cavity structure and the like are relatively costly and there is no real-time mechanism to control and adjust this laser parameter. In addition, for the pump lasers, the optical feedback is relatively unstable due to the location of the mirror (FB grating). This mirror is also susceptible to temperature and environmental changes.

Publications dealing with negative feedback, linewidth, and chirp reduction in semiconductor lasers include Yamamoto, Y., et al., "Theory of a Negative Frequency Feedback Semiconductor Laser," IEEE Journal of Quantum Electronics, vol. QE-21, no. 12, December 1985; Kazarinov, R., et al., The Relation of Line Narrowing and Chirp Reduction Resulting from the Coupling of a Semiconductor Laser to a Passive Resonator," IEEE Journal of Quantum Electronics, vol. QE-23, no. 9, September 1987; Sasai, Y., et al., "Spectral Linewidth and Resonant Frequency Characteristics of InGaAsP/InP Multiquantum Well Lasers," IEEE Journal of Quantum Electronics, vol. 25, no. 4, April 1989; and Kikuchi, K., et al., "Effect of 1/f-Type FM Noise on Semiconductor-Laser Linewidth Residual in High-Power Limit," IEEE Journal of Quantum Electronics, vol. 25, no. 4, April 1989.

The present invention provides a compact semiconductor laser that utilizes electrical feedback to correct for frequency noise in real-time, such that, no matter what the shift in the frequency of the laser is, the electrical feedback compensates for the shift in the frequency of the laser by amplifying a portion of the output signal of the laser that is measured at the back facet of the laser using an etalon that senses the frequency change and converts it into an amplitude change. This amplitude change is combined with the input signal of the laser using a standard negative feedback control method. When the gain of the feedback loop is relatively high, the overall transfer function of the system is dependent on the feedback loop gain block, which is substantially linear and does not shift in frequency. This is accomplished via a large bandwidth photo-detector that is disposed at the back facet of the laser that monitors the optical output power of the etalon and provides a feedback signal to a feedback control circuit. The signal from the large bandwidth photo-detector is used to modify the injection current in order to correct for the large linewidth of the laser.

Thus, the present invention provides a compact semiconductor laser that includes an integrated wavelength locker, and that may be applied to laser-based transmitters and receivers, for example. Any laser chips exhibiting degraded performance in terms of linewidth may benefit greatly from this configuration, wherein the compensation scheme is used as a wavelength locker and a linewidth reducer simultaneously. The configuration may be applied to any systems using alternative modulkation formats, such as frequency-shift keying (FSK), phase-shift keying (PSK), differential phase-shift keing (DPSK), etc. This greatly reduces the costs of the laser-based transmitters and receivers; transmitter optical subassemblies (TOSAs), receiver optical subassemblies (ROSAs), and other small form-factor (SFF) and small form-factor pluggable (SFP) modular optical transceiver packaging standards; bi-directional optical transceiver packages; and fiber sensor and test and measurement instrumentation applications.

In general, a laser includes a cavity disposed between a front facet and a back facet. These facets are mirrors that reflect photons in the cavity. An electrical source is used to create a population inversion in the cavity, thereby creating the spontaneous emission of photons. These photons reflect between the front facet and the back facet in the cavity and encounter excited atoms, thereby producing the stimulated emission of photons. The photons created by this stimulated emission have the same direction as the spontaneously emitted photons that created them, as well as the same phase and wavelength.

A percentage of the photons exit the cavity through one of the facets, which is a mirror with partial reflectivity. Power builds in the cavity until the amount of light exiting the cavity equals the amount of energy being applied to the cavity, minus losses. Typically, in most applications, the front facet is a partially reflective mirror and the back facet is a fully reflective mirror. The electrical source that is used to create the population inversion in the cavity may be an analog signal that is used to modulate the resulting optical signal. Such direct modulation is relatively simple and inexpensive, as compared to external modulation. In external modulation, an external modulator is used to modulate the light from the laser. Typically, external modulation provides improved linearity performance and enhanced stability of the resulting optical signal, at the expense of component complexity and expense.

Figure 1:
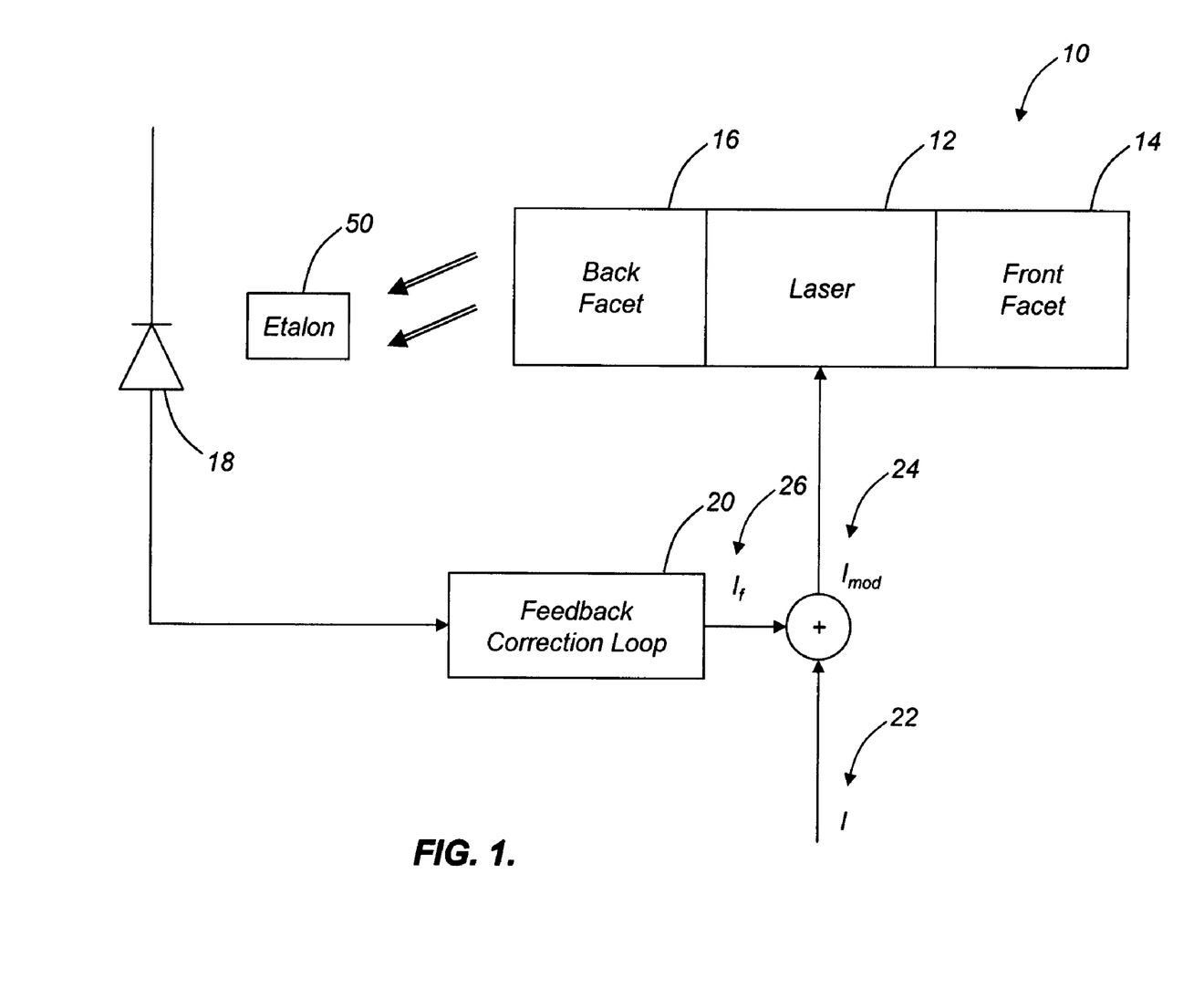
FIG. 1 is a schematic diagram illustrating one exemplary embodiment of the compact semiconductor laser configuration of the present invention, the compact semiconductor laser configuration incorporating a relatively large bandwidth photo-detector and negative feedback correction loop coupled to the back facet of the laser, providing high-gain, linear negative feedback to the input electrical signals.

Referring to FIG. 1, in one exemplary embodiment, the laser configuration 10 of the present invention includes a laser 12, such as a semiconductor laser, laser diode (Fabry-Perot (FP), distributed feedback (DFB), or the like), etc., including a front facet 14 and a back facet 16. These facets 14,16 are mirrors having a predetermined reflectivity based on the desired characteristics of the laser 12. Typically, the optical output power of the laser 12 is measured via a tap and optical splitter coupled to the front facet 14 of the laser 12. This measurement approach has the disadvantage of significantly decreasing the optical output power of the laser 12, as well as adding to component bulk. Optionally, the optical output power of the laser 12 is measured via a photo-detector 18 coupled to the back facet 16 of the laser 12. In such cases, the back facet 16 of the laser 12 is a mirror with partial reflectivity. This partial reflectivity may be relatively small in degree, as the photo-detector 18 is disposed relatively close to the back facet 16 of the laser 12. For example, in a 14-pin butterfly (BFY) package commonly used in optical telecommunications applications (dense wavelength division multiplexing (DWDM) applications, etc.), the laser diode includes a single-mode optical fiber pigtail, a heat sink, a thermoelectric (TE) cooler, a thermistor, and a monitor diode (photo-detector 18). The case is coupled to the laser chip via an anode and is grounded.

The laser configuration 10 of the present invention also includes an etalon 50, FP interferometer, or the like disposed at the back facet of the laser 12. This etalon 50 senses any frequency change in the output signal of the laser 12 and coverts this frequency change into an amplitude change that is combined with the input signal of the laser, as described below. In general, the etalon 50 is a frequency tuning device that exploits the properties of interference between two flat, parallel surfaces.

Figure 4:
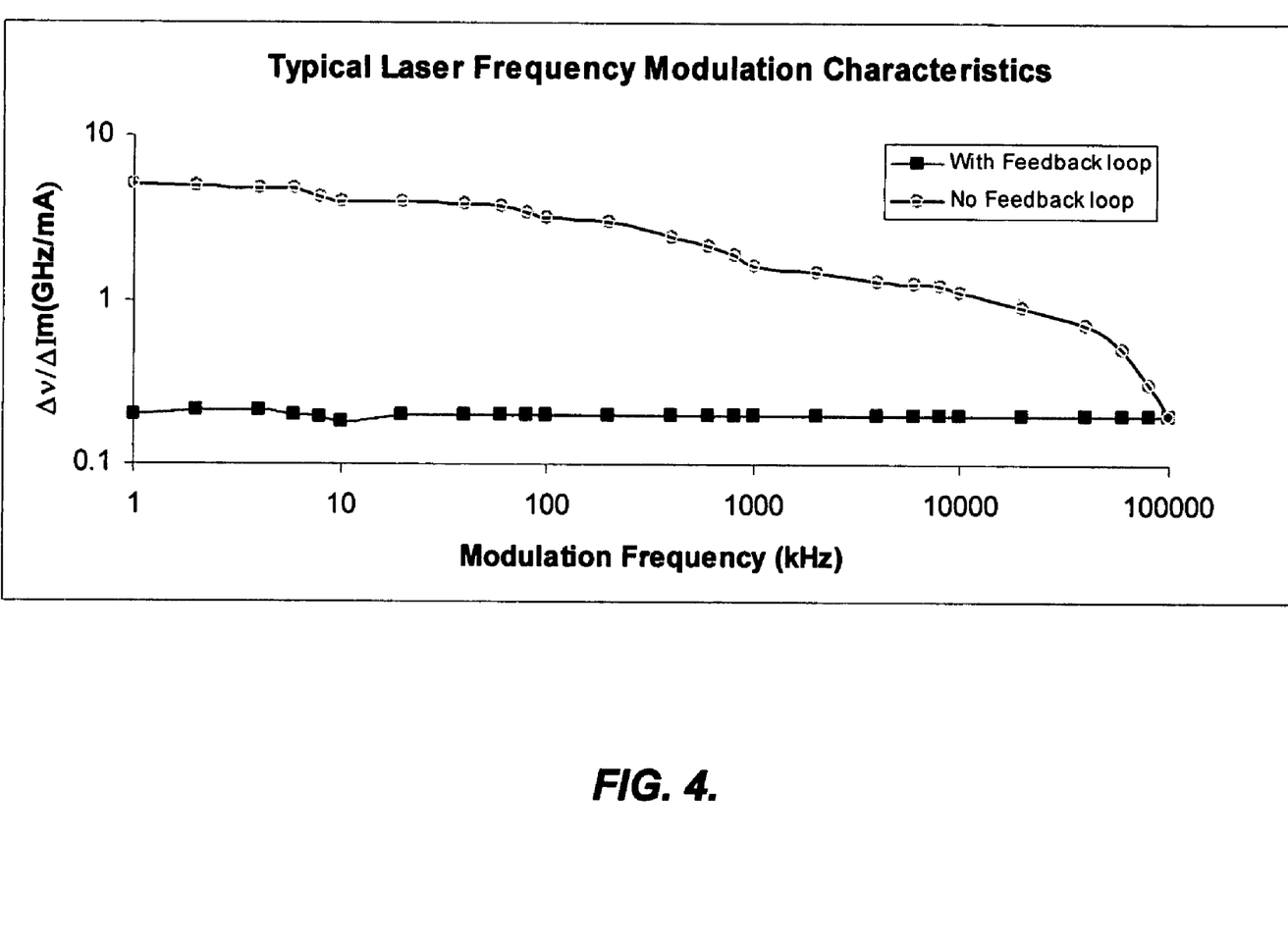
FIG. 4 is a plot illustrating typical laser frequency modulation characteristics with and without the negative feedback correction loop of the present invention.

The laser configuration 10 of the present invention also includes a feedback correction loop 20 coupled to the photo-detector 18. The input electrical current 22 (I) of the laser 12 is modulated, resulting in modulation electrical current 24 ($I_{mod}$), which is modified by feedback electrical current 26 ($I_f$). Advantageously, if the laser transfer function=X, the feedback correction loop transfer function=Y, the overall system transfer function=Z, Z=X/(1+XY), and Y, being, by nature, substantially linear, is amplified such that Y>>1, then Z=1/Y and is substantially linear. Here, Z=$\Delta v/\Delta$Im, where $\Delta v$ is the change in linewidth and $\Delta$Im is the change in injection current. Typical laser frequency modulation characteristics with and without the feedback correction loop 20 of the present invention are illustrated in FIG. 4. Therefore, via the etalon 50 and the feedback correction loop 20, the large linewidth of the laser 12 may be corrected for.

Figure 2:
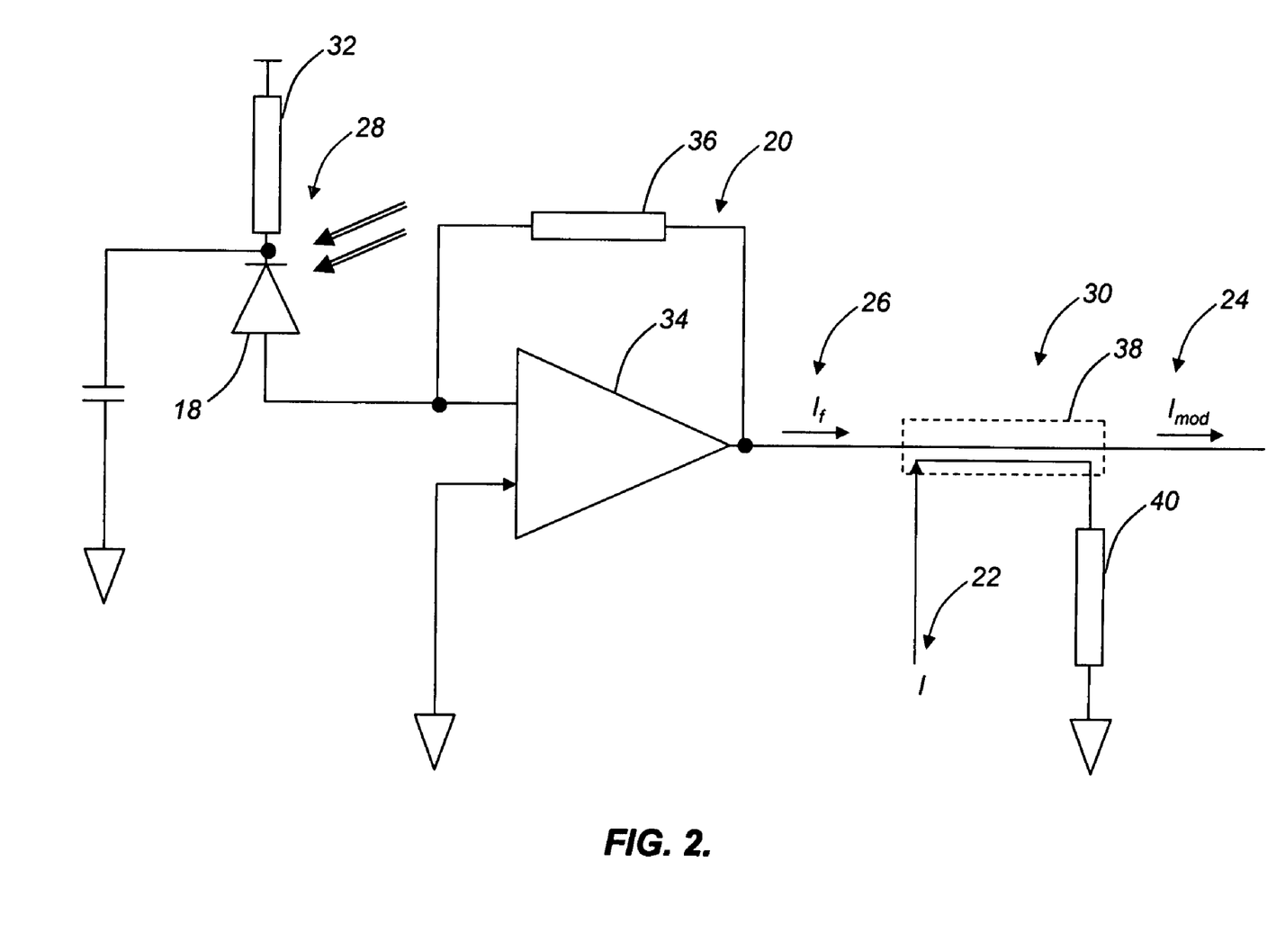
FIG. 2 is a schematic diagram illustrating one exemplary embodiment of the negative feedback correction loop of FIG. 1.

Referring to FIG. 2, preferably, the feedback correction loop 20 is a negative (180-degree inversion) feedback correction loop, although other suitable feedback correction loops may be used. In general, for purposes of illustration, the photo-detector assembly 28, the feedback correction loop 20, and the linearization control circuit 30 include the photo-detector 18 and a resistor 32, a transimpedance amplifier (TIA) 34 and a feedback resistor 36 ($R_f$), and a radio frequency (RF) combiner 38 and a resistor 40 (such as a 50 ohm resistor or the like), respectively. The photo-detector assembly 28, disposed at the back facet 16 (FIG. 1) of the laser 12 (FIG. 1), and the feedback correction loop 20 provide the feedback electrical current 26 ($I_f$) to the linearization control circuit 30, where the feedback electrical current 26 ($I_f$) is combined with the input electrical current 22 (I) to form the modulation electrical current 24 ($I_{mod}$), which modulates the laser 12. The output of the TIA 34 is 180 degrees out-of-phase with the input.

Referring again to FIG. 1, preferably, the back facet 16 of the laser 12 incorporates a relatively large bandwidth photo-detector 18 that both monitors the optical output power of the system (as is done with conventional systems) and provides a feedback signal to the linearization control circuit 30 (FIG. 2). For example, a 2.5 GHz bandwidth photo-detector 18 is used for the transmission of a 2.5 GHz optical signal, a 10 GHz bandwidth photo-detector 18 is used for the transmission of a 10 GHz optical signal, etc. Thus, the photodiode specification (and the specification of each system component, including the laser 12) is carefully selected such that it coincides with the desired rate (signal frequency).

The use of this relatively large bandwidth photo-detector 18 at the back facet 16 of the laser 12 for providing a feedback signal to the linearization control circuit is novel and has been rejected by conventional systems and methods. Therefore, the use of the relatively large bandwidth photo-detector 18 at the back facet 16 of the laser 12 for providing a feedback signal that is used to reduce the linewidth of the laser 12 in real time is also novel. For example, U.S. Pat. No. 5,311,005, issued to Visocchi on May 10, 1994, states:

Compensation of the slope variation of a laser diode due to temperature and/or time is thus achieved without the use of low frequency ripple or peak detection, rather the a.c. and mean optical powers are compared in order to obtain the optimum optical extinction ratio. The a.c. optical signal power is used to indicate a reduction in slope efficiency.

The description above refers to laser diodes for use in optical fibre transmission systems. There is, however, growing interest in optical microwave subcarrier communications and transmitters therefore, which would also employ laser diodes and require slope variation compensation. The arrangement described above with reference to FIG. 1 is not suitable for such microwave applications without modification. This is due to the limited bandwidth of the back facet photodiode 12 and the problem is enhanced as the bit rate increases. If the overall optical transmitter were to be employed as an analogue transmitter where a small microwave signal was modulated on the linear portion of the laser diode characteristic, a conventional back facet photodiode would not be usable.

Figure 3:
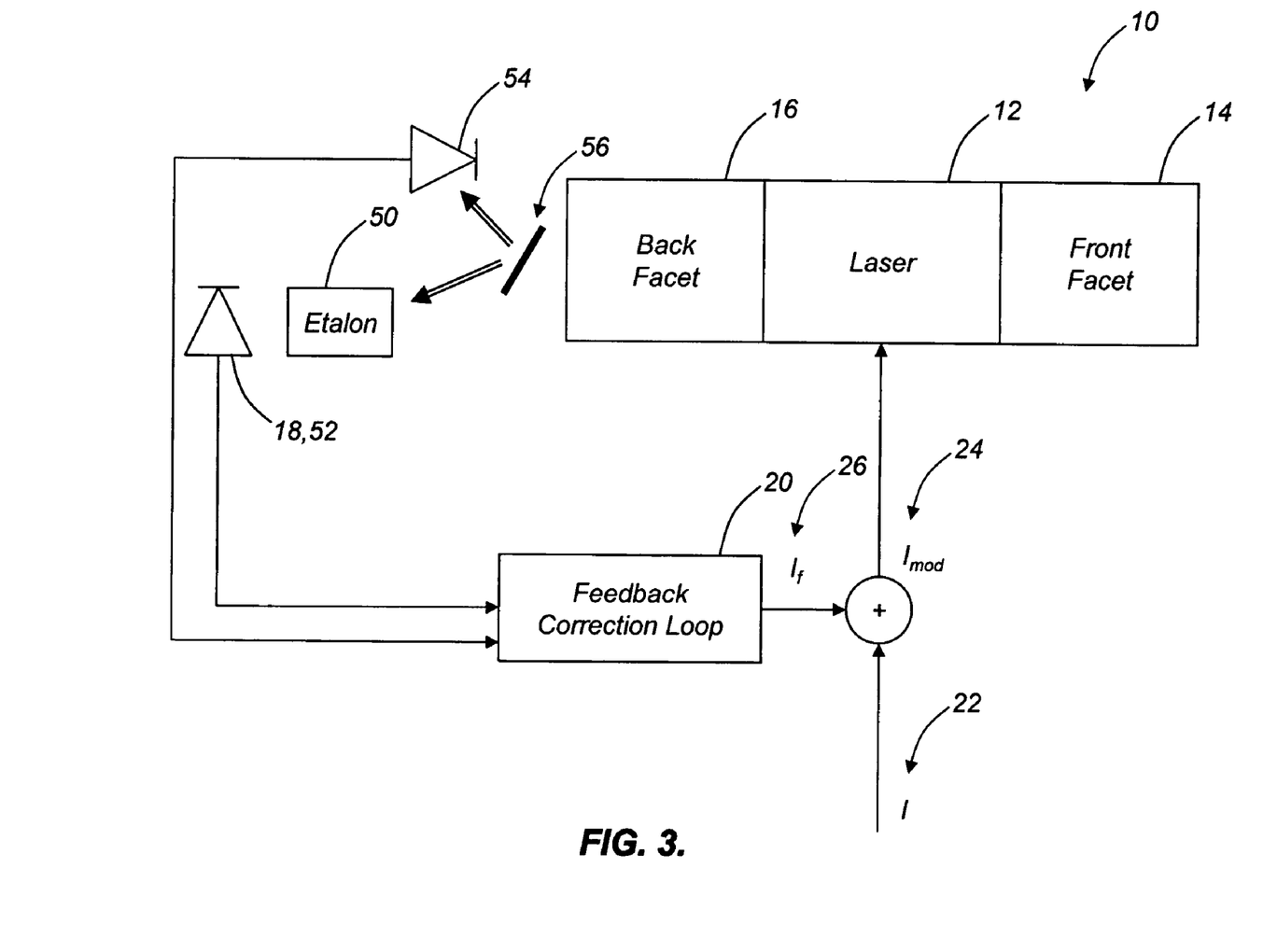
FIG. 3 is a schematic diagram illustrating another exemplary embodiment of the compact semiconductor laser configuration of the present invention, the compact semiconductor laser configuration incorporating a relatively large bandwidth photo-detector (incorporating both a primary and reference photo-detector), beam splitter, and negative feedback correction loop coupled to the back facet of the laser, providing high-gain, linear negative feedback to the input electrical signals.

However, a fibre optical coupler 30 can be arranged at the laser diode output as indicated in FIG. 3 so as to split off a small proportion of the output signal and apply it to a very high frequency microwave PIN photodiode 32, for example a 30 GHz device, and the slope may be very accurately compensated as a result. The remainder of the laser diode optical output is available from the coupler 30 at output 34. The output of PIN photodiode 32 is applied to two loops as before. The d.c. information is applied to loop 1 including a low pass filter 34 and compared with a reference voltage Vr1 used to set the d.c. (mean power) operating point. The resultant error signal ΔV1 is applied to a transconductance amplifier 36 to produce bias current Ib' which is low pass filtered at 38 and the resultant bias current Ib applied to the laser diode 10.

Referring to FIG. 3, in another exemplary embodiment, the laser configuration 10 of the present invention includes a laser 12, such as a semiconductor laser, laser diode (FP, DFB, or the like), etc., including a front facet 14 and a back facet 16. Again, these facets 14,16 are mirrors having a predetermined reflectivity based on the desired characteristics of the laser 12. Typically, the optical output power of the laser 12 is measured via a tap and optical splitter coupled to the front facet 14 of the laser 12. This measurement approach has the disadvantage of significantly decreasing the optical output power of the laser 12, as well as adding to component bulk. Optionally, the optical output power of the laser 12 is measured via a photo-detector 18 coupled to the back facet 16 of the laser 12. In such cases, the back facet 16 of the laser 12 is a mirror with partial reflectivity. Again, this partial reflectivity may be relatively small in degree, as the photo-detector 18 is disposed relatively close to the back facet 16 of the laser 12. For example, in a 14-pin BFY package commonly used in optical telecommunications applications (DWDM applications, etc.), the laser diode includes a single-mode optical fiber pigtail, a heat sink, a TE cooler, a thermistor, and a monitor diode (photo-detector 18). The case is coupled to the laser chip via an anode and is grounded.

The laser configuration 10 of the present invention also includes an etalon 50, FP interferometer, or the like disposed at the back facet of the laser 12. Again, this etalon 50 senses any frequency change in the output signal of the laser 12 and coverts this frequency change into an amplitude change that is combined with the input signal of the laser, as described below. In general, the etalon 50 is a frequency tuning device that exploits the properties of interference between two flat, parallel surfaces.

The output signal of the laser 12 is split between a primary photo-detector 52 and reference photo-detector 54 via a beam splitter 56, wherein the output signal received by the reference photo-detector 54 is unencumbered by the etalon 50. Basically, the reference photo-detector 54 monitors the laser output power and uses this measurement as a reference. The primary photo-detector 52 simultaneously monitors the etalon output power. When the ratio between these two output powers changes, a linewidth adjustment is carried out.

The laser configuration 10 of the present invention also includes a feedback correction loop 20 coupled to the primary photo-detector 52 and reference photo-detector 54. The input electrical current 22 (I) of the laser 12 is modulated, resulting in modulation electrical current 24 ($I_{mod}$), which is modified by feedback electrical current 26 ($I_f$). Advantageously, if the laser transfer function=X, the feedback correction loop transfer function=Y, the overall system transfer function=Z, Z=X/(1+XY), and Y, being, by nature, substantially linear, is amplified such that Y>>1, then Z=1/Y and is substantially linear. Here, Z=Δv/ΔIm, where Δv is the change in linewidth and ΔIm is the change in injection current. Again, typical laser frequency modulation characteristics with and without the feedback correction loop 20 of the present invention are illustrated in FIG. 4. Therefore, via the etalon 50 and the feedback correction loop 20, the large linewidth of the laser 12 may be corrected for.

Although the present invention has been illustrated and described herein with reference to preferred embodiments and specific examples thereof, it will be readily apparent to those of ordinary skill in the art that other embodiments and examples may perform similar functions and/or achieve like results. All such equivalent embodiments and examples are contemplated by the present invention, fall within the spirit and scope thereof, and are intended to be covered by the following claims.

What is claimed is:

1. A system for real-time linewidth reduction in an optical source, comprising:

a laser device comprising a back facet, wherein the laser device receives a modulated input current that is modulated with a data signal and generates an optical output signal;

an etalon device adjacent to the back facet of the laser device, wherein the etalon device receives an optical feedback output signal from the back facet of the laser device, and wherein the etalon device monitors the optical feedback output signal for changes in frequency and, if they exist, generates an optical correction output signal;

a photo-detector device disposed adjacent to the etalon device, wherein the photo-detector device receives the optical feedback and correction output signals, and wherein the photo-detector device converts the optical feedback and correction output signals into an electrical signal; and a real-time linewidth reduction feedback correction loop coupled to the photo-detector device, wherein the real-time linewidth reduction feedback correction loop receives the electrical signal from the photo-detector device and generates a substantially linear feedback current to correct a linewidth in the optical output signal, wherein the substantially linear feedback current is generated responsive to the electrical signal;

wherein the modulated input current is modified by the substantially linear feedback current to maintain a stable linewidth of the optical output signal, wherein the output optical signal is frequency modulated thereby requiring the stable linewidth.

2. The system of claim 1, wherein the photo-detector device comprises a primary photo-detector device that receives the optical correction output signal from the etalon device and a reference photo-detector device that receives the optical feedback output signal from the back facet of the laser device.

3. The system of claim 2, further comprising a beam splitter disposed between the reference photo-detector and etalon devices and the back facet of the laser device, wherein the reference photo-detector and etalon devices receive the optical feedback output signal from the back facet of the laser device via the beam splitter.

4. The system of claim 1, wherein the back facet of the laser device comprises a partially reflective mirror.

5. The system of claim 1, wherein the modulated input current comprises a substantially linear modulated input current such that the real-time linewidth reduction feedback correction loop does not shift in frequency.

6. The system of claim 1, wherein the photo-detector device comprises a photo-detector device having a bandwidth of between about 100 MHz and about 20 GHz, wherein the bandwidth is selected responsive to a bandwidth of the frequency modulated output optical signal.

7. The system of claim 1, wherein the feedback correction loop comprises a negative feedback correction loop operating on the laser device.

8. The system of claim 1, wherein a gain of the input current is about 0 dB, a gain of the substantially linear feedback current is about 60 dB (electrical gain), and a gain of the modulated input current is about 0 dB.

9. The system of claim 1, wherein, if a laser device transfer function=X, the feedback correction loop transfer function =Y, the overall system transfer function=Z, Z=X/(1+XY), and Y, being, by nature, substantially linear, is amplified such that Y>>1, then Z=1/Y and is substantially linear; and wherein Z=$\Delta v/\Delta Im$, where $\Delta v$ is the change in linewidth and $\Delta Im$ is the change in injection current.

10. The system of claim 1, wherein the laser device comprises one of a semiconductor laser and a laser diode.

11. A method for real-time linewidth reduction in an optical source, comprising:
providing a laser device comprising a back facet, wherein the laser device receives a modulated input current that is modulated with a data signal and generates an optical output signal;
providing an etalon device adjacent to the back facet of the laser device, wherein the etalon device receives an optical feedback output signal from the back facet of the laser device, and wherein the etalon device monitors the optical feedback output signal for changes in frequency and, if they exist, generates an optical correction output signal;
providing a photo-detector device disposed adjacent to the etalon device, wherein the photo-detector device receives the optical feedback and correction output signals, and wherein the photo-detector device converts the optical feedback and correction output signals into an electrical signal;
providing a real-time linewidth reduction feedback correction loop coupled to the photo-detector device, wherein the real-time linewidth reduction feedback correction loop receives the electrical signal from the photo-detector device and generates a substantially linear feedback current, wherein the substantially linear feedback current is generated responsive to the electrical signal; and
correcting the modulated input current with the substantially linear feedback current to correct a linewidth in the optical output signal, wherein to correct the linewidth comprises maintaining in real-time a stable linewidth of the output optical signal, and wherein the output optical signal is frequency modulated thereby requiring the stable linewidth.

12. The method of claim 11, wherein the photo-detector device comprises a primary photo-detector device that receives the optical correction output signal from the etalon device and a reference photo-detector device that receives the optical feedback output signal from the back facet of the laser device.

13. The method of claim 12, further comprising a beam splitter disposed between the reference photo-detector and etalon devices and the back facet of the laser device, wherein the reference photo-detector and etalon devices receive the optical feedback output signal from the back facet of the laser device via the beam splitter.

14. The method of claim 11, wherein the back facet of the laser device comprises a partially reflective mirror.

15. The method of claim 11, wherein the modulated input current comprises a substantially linear modulated input current such that the real-time linewidth reduction feedback correction loop does not shift in frequency.

16. The method of claim 11, wherein the photo-detector device comprises a photo-detector device having a bandwidth of between about 100 MHz and about 20 GHz, wherein the bandwidth is selected responsive to a bandwidth of the frequency modulated output optical signal.

17. The method of claim 11, wherein the feedback correction loop comprises a negative feedback correction loop operating on the laser device.

18. The method of claim 11, wherein a gain of the input current is about 0 dB, a gain of the substantially linear feedback current is about 60 dB (electrical gain), and a gain of the modulated input current is about 0 dB.

19. The method of claim 11, wherein, if a laser device transfer function=X, the feedback correction loop transfer function=Y, the overall system transfer function=Z, Z=X/(1+XY), and Y, being, by nature, substantially linear, is amplified such that Y>>1, then Z=1/Y and is substantially linear; and wherein Z=$\Delta v)/\Delta Im$, where $\Delta v$ is the change in linewidth and $\Delta Im$ is the change in injection current.

20. The method of claim 11, wherein the laser device comprises one of a semiconductor laser and a laser diode.

21. A system for real-time linewidth reduction in an optical source, comprising:
a laser device comprising a back facet, wherein the laser device receives a modulated input current that is modulated with a data signal and generates an optical output signal;
an etalon device adjacent to the back facet of the laser device, wherein the etalon device receives an optical feedback output signal from the back facet of the laser device, and wherein the etalon device monitors the optical feedback output signal for changes in frequency and, if they exist, generates an optical correction output signal;
a photo-detector device disposed adjacent to the etalon device, wherein the photo-detector device receives the optical feedback and correction output signals, and wherein the photo-detector device converts the optical feedback and correction output signals into an electrical signal;
wherein the photo-detector device comprises a primary photo-detector device that receives the optical correction output signal from the etalon device and a reference photo-detector device that receives the optical feedback output signal from the back facet of the laser device; and a real-time linewidth reduction feedback correction loop coupled to the photo-detector device, wherein the real-time linewidth reduction feedback correction loop receives the electrical signal from the photo-detector device and generates a substantially linear feedback current to correct a linewidth in the optical output signal, wherein the substantially linear feedback current is generated responsive to the electrical signal;

wherein the modulated input current is modified by the substantially linear feedback current to maintain a stable linewidth of the optical output signal, wherein the output optical signal is frequency modulated thereby requiring the stable linewidth.

22. The system of claim 21, further comprising a beam splitter disposed between the reference photo-detector and etalon devices and the back facet of the laser device, wherein the reference photo-detector and etalon devices receive the optical feedback output signal from the back facet of the laser device via the beam splitter.

* * * * *